United States Patent
Zhang

(10) Patent No.: US 12,334,927 B2
(45) Date of Patent: Jun. 17, 2025

(54) ONE-SHOT CIRCUIT

(71) Applicant: SG MICRO CORP, Beijing (CN)

(72) Inventor: Lidi Zhang, Beijing (CN)

(73) Assignee: SG MICRO CORP, Beijing (CN)

( * ) Notice: Subject to any disclaimer, the term of this patent is extended or adjusted under 35 U.S.C. 154(b) by 0 days.

(21) Appl. No.: 18/032,353

(22) PCT Filed: Oct. 20, 2022

(86) PCT No.: PCT/CN2022/126420
§ 371 (c)(1),
(2) Date: Apr. 18, 2023

(87) PCT Pub. No.: WO2024/045291
PCT Pub. Date: Mar. 7, 2024

(65) Prior Publication Data
US 2025/0080090 A1   Mar. 6, 2025

(30) Foreign Application Priority Data
Sep. 1, 2022   (CN) .......................... 202211067267.3

(51) Int. Cl.
*H03K 3/03*   (2006.01)
*H03K 3/013*   (2006.01)
*H03K 3/033*   (2006.01)

(52) U.S. Cl.
CPC ............ *H03K 3/033* (2013.01); *H03K 3/013* (2013.01)

(58) Field of Classification Search
CPC ................................ H03K 3/033; H03K 3/013
See application file for complete search history.

(56) References Cited

U.S. PATENT DOCUMENTS

| | | | | |
|---|---|---|---|---|
| 5,929,684 A | * | 7/1999 | Daniel | ...................... H03K 5/04 327/299 |
| 2015/0178143 A1 | | 6/2015 | Mathew et al. | |
| 2018/0183419 A1 | * | 6/2018 | Arbetter | ............. H03K 3/02337 |

FOREIGN PATENT DOCUMENTS

| | | |
|---|---|---|
| CN | 102368171 A | 3/2012 |
| CN | 105281771 A | 1/2016 |
| CN | 110729991 A | 1/2020 |
| CN | 210690666 U | 6/2020 |
| CN | 212460063 U | 2/2021 |
| GB | 1391560 A | 4/1975 |

* cited by examiner

*Primary Examiner* — Daniel C Puentes
(74) *Attorney, Agent, or Firm* — Bayramoglu Law Offices LLC

(57) ABSTRACT

A one-shot circuit is provided. The one-shot circuit includes a one-shot main circuit and a shielding time window circuit. The one-shot main circuit is configured to receive, through a NOR gate, an input signal of the one-shot circuit, the feedback of an output signal of the one-shot circuit, and a time window signal output by the shielding time window circuit, and then obtain the output signal through a first RC delay circuit and a logic gate. The time window signal is a signal that resists the interference of the abnormal pulse of the input signal with the output signal. The shielding time window circuit is configured to receive the feedback of the output signal, and then obtain the time window signal through a second RC delay circuit and a logic gate.

11 Claims, 3 Drawing Sheets

US 12,334,927 B2

ONE-SHOT CIRCUIT

CROSS REFERENCE TO THE RELATED APPLICATIONS

This application is the national phase entry of International Application No. PCT/CN2022/126420, filed on Oct. 20, 2022, which is based upon and claims priority to Chinese Patent Application No. 2022110672673, filed on Sep. 1, 2022, the entire contents of which are incorporated herein by reference.

TECHNICAL FIELD

Embodiments of the present disclosure relate to the technical field of integrated circuits, in particular, to a one-shot circuit.

BACKGROUND

A one-shot circuit is widely applied to pulse shaping, delay (generation of an output pulse lagging behind a triggering pulse) and timing (generation of a pulse signal with a fixed time width). A delay effect is achieved by the charging and discharging of a Resistance-Capacitance (RC) circuit, and a time length depends on circuit parameters.

In some low-speed logic chips, it is usually desired that the next one-shot is allowed to be triggered after a long time T after the triggering of a One-shot (an output signal of the one-shot circuit). Compared with the conventional one-shot circuit, within the time interval T, an input signal of the one-shot circuit may have an abnormal pulse, and the abnormal pulse may trigger the One-shot signal by mistake, affecting an actual application.

SUMMARY

An embodiment described herein provides a one-shot circuit, for the purpose of solving the problem that the existing one-shot circuit may be triggered by mistake by an abnormal pulse of an input signal.

A first aspect of the present disclosure provides a one-shot circuit. The one-shot circuit includes a one-shot main circuit and a shielding time window circuit. The one-shot main circuit is configured to receive, through a NOR gate, an input signal of the one-shot circuit, a feedback of an output signal of the one-shot circuit, and a time window signal output by the shielding time window circuit, and then obtain the output signal through a first RC delay circuit and a logic gate. The time window signal is a signal that resists the interference of the abnormal pulse of the input signal with the output signal. The shielding time window circuit is configured to receive a feedback of the output signal, and then obtain the time window signal through a second RC delay circuit and a logic gate.

Optionally, the one-shot main circuit includes the NOR gate, the first RC delay circuit, a first NOT gate, a second NOT gate, and a NAND gate. An input end of the NOR gate receives the input signal, the feedback of the output signal, and the time window signal. An output end of the NOR gate is connected to the first RC delay circuit. The first RC delay circuit is configured to delay a signal through the charging and discharging of a capacitor. An output end of the first RC delay circuit is connected to an input end of the first NOT gate. An output end of the first NOT gate is connected to one input end of the NAND gate, the other input end of the NAND gate is connected to the input signal, and an output end of the NAND gate is connected to an input end of the second NOT gate. An output end of the second NOT gate outputs the output signal.

Optionally, the shielding time window circuit includes the second RC delay circuit and a third NOT gate. The second RC delay circuit is configured to delay the signal through the charging and discharging of the capacitor. An input end of the second RC delay circuit receives the feedback of the output signal, an output end of the second RC delay circuit is connected to an input end of the third NOT gate, and an output end of the third NOT gate outputs the time window signal.

Optionally, the first RC delay circuit includes a first transistor, a second transistor, a first resistor, and a first capacitor. Gates of the first transistor and the second transistor are both connected to the output end of the NOR gate. A source of the first transistor is connected to a power supply end. A source of the second transistor is connected to a ground end. A drain of the first transistor is connected to one end of the first resistor. A drain of the second transistor is connected to the other end of the first resistor. The first transistor is a P-type transistor. The second transistor is an N-type transistor. The first capacitor is connected in parallel with the second transistor. One end of the first capacitor is connected to the drain of the second transistor, and the other end of the first capacitor is connected to the source of the second transistor. An intermediate node between the first resistor and the second transistor is connected to the input end of the first NOT gate.

Optionally, the second RC delay circuit includes a third transistor, a fourth transistor, a second resistor, and a second capacitor. Gates of the third transistor and the fourth transistor both receive the feedback of the output signal. A source of the third transistor is connected to a power supply end. A source of the fourth transistor is connected to a ground end. A drain of the third transistor is connected to one end of the second resistor. A drain of the fourth transistor is connected to the other end of the second resistor. The third transistor is a P-type transistor. The fourth transistor is an N-type transistor. The second capacitor is connected in parallel with the fourth transistor. One end of the second capacitor is connected to the drain of the fourth transistor, and the other end of the second capacitor is connected to the source of the fourth transistor. An intermediate node between the second resistor and the fourth transistor is connected to the input end of the third NOT gate.

Optionally, the discharging time constant of the second RC delay circuit is less than a charging time length of the first RC delay circuit.

Optionally, the initial low level time length of the input signal is greater than a first preset time length. The first preset time length is the time length that the third transistor and the second resistor pull the input of the third NOT gate to a high level.

Optionally, the sum of a discharging time length of the second RC delay circuit and a charging time length of the second RC delay circuit is less than or equal to a second preset time length. The second preset time length is a preset interval time length triggered by the one-shot circuit.

Optionally, the sum of the discharging time length of the second RC delay circuit and the charging time length of the second RC delay circuit is greater than or equal to the time length from the beginning of the input signal to the end of the abnormal pulse.

Optionally, the one-shot circuit is a one-shot circuit in a low-speed chip.

A second aspect of the present disclosure provides a one-shot circuit. The one-shot circuit includes an NOR gate, first to fourth transistors, a first resistor, a second resistor, a first capacitor, a second capacitor, a first NOT gate, a second NOT gate, a third NOT gate, and a NAND gate. An input end of the NOR gate receives an input signal of the one-shot circuit, the feedback of an output signal of the one-shot circuit, and a time window signal. An output end of the NOR gate is connected to a gate of the first transistor and a gate of the second transistor. A source of the first transistor is connected to a power supply end. A source of the second transistor is connected to a ground end. A drain of the first transistor is connected to one end of the first resistor. A drain of the second transistor is connected to the other end of the first resistor. The first transistor is a P-type transistor. The second transistor is an N-type transistor. The first capacitor is connected in parallel with the second transistor. One end of the first capacitor is connected to the drain of the second transistor, and the other end of the first capacitor is connected to the source of the second transistor. An intermediate node between the first resistor and the second transistor is connected to an input end of the first NOT gate. An output end of the first NOT gate is connected to one input end of the NAND gate, and the other input end of the NAND gate is connected to the input signal. An output end of the NAND gate is connected to an input end of the second NOT gate. An output end of the second NOT gate outputs the output signal. A gate of the third transistor and a gate of the fourth transistor receive the feedback of the output signal. A source of the third transistor is connected to a power supply end. A source of the fourth transistor is connected to a ground end. A drain of the third transistor is connected to one end of the second resistor, and a drain of the fourth transistor is connected to the other end of the second resistor. The third transistor is a P-type transistor. The fourth transistor is an N-type transistor The second capacitor is connected in parallel with the fourth transistor One end of the second capacitor is connected to the drain of the fourth transistor, and the other end of the second capacitor is connected to the source of the fourth transistor. An intermediate node between the second resistor and the fourth transistor is connected to an input end of the third NOT gate. An output end of the third NOT gate outputs the time window signal.

The one-shot circuit of the embodiment of the present disclosure includes a one-shot main circuit and a shielding time window circuit. The one-shot main circuit is configured to receive, through the NOR gate, the input signal of the one-shot circuit, the feedback of the output signal of the one-shot circuit, and the time window signal output by the shielding time window circuit, and then obtain the output signal through the first RC delay circuit and the logic gate. The time window signal is a signal that resists the interference of the abnormal pulse of the input signal with the output signal. The shielding time window circuit is configured to receive the feedback of the output signal, and then obtain the time window signal through the second RC delay circuit and the logic gate. Compared with the existing one-shot circuit, in the one-shot circuit of the embodiment of the present disclosure, the NOT gate that receives the input signal is replaced with the NOR gate that can receive three paths of signals, and the shielding time window circuit is added. The shielding time window circuit may obtain the time window signal that can resist the interference of the abnormal pulse of the input signal with the output signal according to the feedback of the output signal, which effectively eliminates the false triggering of the abnormal pulse on the One-shot signal.

BRIEF DESCRIPTION OF THE DRAWINGS

To describe the technical solutions in the embodiments of the present disclosure more clearly, the following briefly describes the drawings required for describing the embodiments. It is to be known that following drawings in the following description show merely some embodiments of the present disclosure, rather than limiting the present disclosure.

Figure 1:
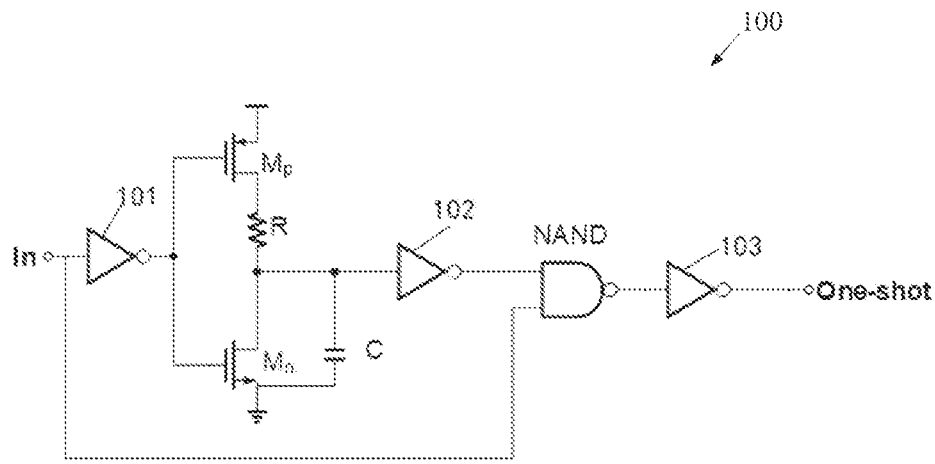
FIG. 1 is an exemplary circuit diagram of an existing one-shot circuit.

Elements in the drawings are schematic and not drawn to scale.

DETAILED DESCRIPTION OF THE EMBODIMENTS

In order make the purpose, technical solutions, and advantages of the embodiments of the present disclosure clearer, the technical solutions in the embodiments of the present disclosure will be described clearly and completely below with reference to the drawings. It is apparent that the described embodiments are part rather than all embodiments of the present disclosure. On the basis of the description of the embodiments of the present disclosure, all other embodiments obtained by those skilled in the art without creative work shall fall within the scope of protection of the present disclosure.

Unless otherwise defined, all terms used herein (including technical and scientific terms) have the same meanings as those commonly understood by those skilled in the art that the subject of the present disclosure belongs. Further, it is to be understood that terms such as those defined in commonly used dictionaries should be interpreted as having the meanings consistent with those in the context of the specification and related technologies, and will not be interpreted in an idealized or overly formal form, unless otherwise defined herein. As used herein, the statement that two or more parts are "connected" or "coupled" together shall mean that these parts are combined directly or through one or more intermediate parts.

In all embodiments of the present disclosure, terms such as "first" and "second" are only used for distinguishing one component (or one part of a component) from another component (or another part of a component).

Figure 2:
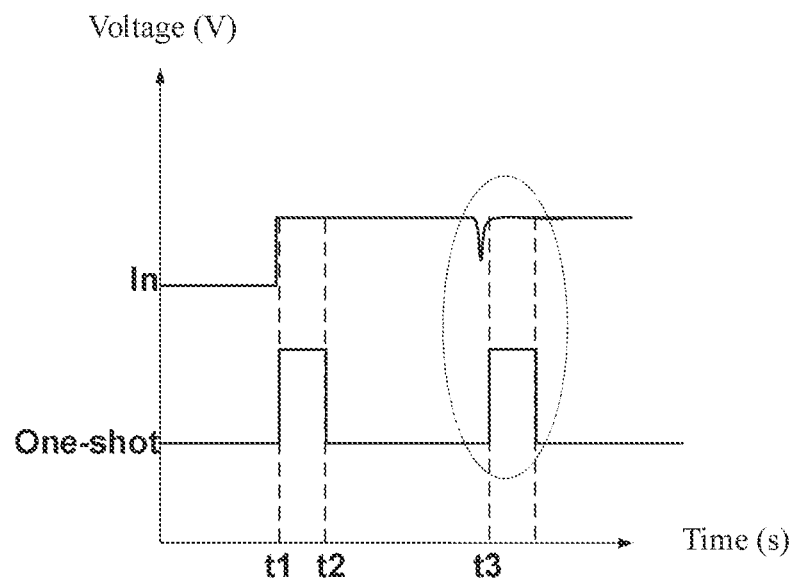
FIG. 2 is a waveform diagram of the signal corresponding to the circuit of FIG. 1.

In order to solve the problem that the existing one-shot circuit may be triggered by mistake due to an abnormal pulse of an input signal, the present disclosure analyzes a working process of an existing one-shot circuit first. FIG. 1 is an exemplary circuit diagram of an existing one-shot circuit 100. FIG. 2 is a waveform diagram of the signal corresponding to the circuit of FIG. 1. The existing one-shot circuit 100 is analyzed below with reference to FIG. 1 and FIG. 2. When In is logic "0", one input of a NAND gate is "0", so the NAND outputs logic "1", and an output signal One-Shot of an phase inverter 103 is logic "0". When In is logic "0", the output of a phase inverter 101 is logic "1", Mp is turned off, and Mn is turned on to pull an input of a phase inverter 102 down to logic "0", so an output of 102 is logic "1". At time t1, In becomes high, due to the existence of R and C, the input of 102 cannot change immediately, and the output is still logic "1", so One-shot becomes logic "1". After In becomes high, the output of 101 becomes logic "0", Mp is turned on, and Mn is turned off. Mp and R charge the input of the phase inverter 102. Assuming that Mp impedance may be ignored, a charging time constant is $\tau=R*C$. Assuming that a flipping level of all phase inverters is half of a supply voltage, after 0.7 time constant, that is, at time t2, the output flipping of the phase inverter 102 becomes logic "0", and One-shot becomes logic "0".

In some low-speed logic chips, it is usually desired that the next One-shot is allowed to be triggered after a long time T after the triggering of one One-Shot. For the one-shot circuit 100 in FIG. 1, in this time interval T, for example, in FIG. 2, when In has a downward abnormal pulse at time t3, if a pulse amplitude is low enough to make the output of the phase inverter 101 become logic "1", then Mn is turned on to discharge the input of the phase inverter 102, and the output of 102 will become logic "1". When the abnormal pulse changes back to a high level, the One-shot will become logic "1" again, so the abnormal pulse triggers a One-shot signal by mistake.

For the abovementioned analysis of the existing one-shot circuit 100 and the existing problem of false triggering of the abnormal pulse, the present disclosure provides a new one-shot circuit 200. The one-shot circuit of the present disclosure is an anti-interference one-shot circuit. The optimization solution is mainly proposed for the problem of false triggering of the abnormal pulse in a low-speed chip application. The one-shot circuit 200 of the present disclosure is described in detail below.

Figure 3:
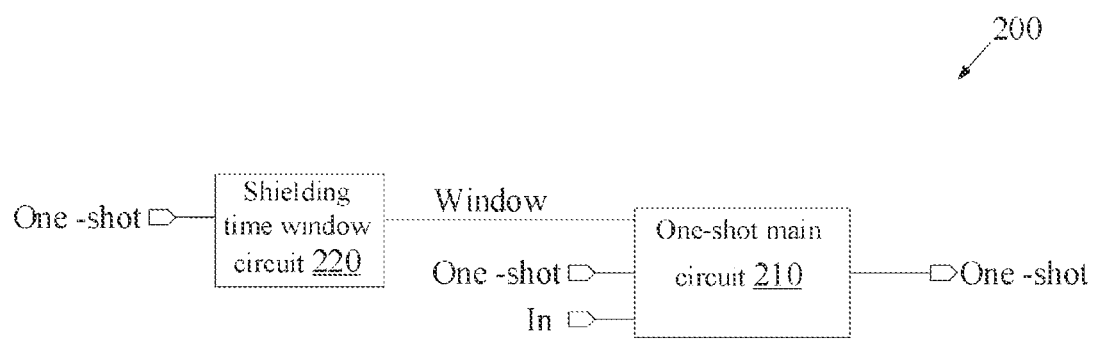
FIG. 3 is a schematic structural diagram of a one-shot circuit of an embodiment of the present disclosure.

FIG. 3 is a schematic structural diagram of a one-shot circuit 200 of an embodiment of the present disclosure. The one-shot circuit 200 includes a one-shot main circuit 210 and a shielding time window circuit 220. The one-shot main circuit 210 is connected to the shielding time window circuit 220, and is configured to receive, through a NOR gate, an input signal In of the one-shot circuit, a feedback of an output signal One-shot of the one-shot circuit, and a time window signal Window output by the shielding time window circuit 220, and then obtain the output signal One-shot through a first RC delay circuit and a logic gate. The time window signal Window is a signal that resists the interference of the abnormal pulse of the input signal In with the output signal One-shot. The shielding time window circuit 220 is configured to receive the feedback of the output signal One-shot, and then obtain the time window signal Window through a second RC delay circuit and a logic gate. Compared with the existing one-shot circuit 100, in the one-shot circuit 200 of the embodiment of the present disclosure, the NOT gate 101 that receives the input signal In is replaced with the NOR gate that can receive three paths of signals, and the shielding time window circuit 220 is added. The shielding time window circuit 220 may obtain the time window signal that can resist the interference of the abnormal pulse of the input signal In with the output signal One-shot according to the feedback of the output signal One-shot, which effectively eliminates the false triggering of the abnormal pulse on the One-shot signal.

Figure 4:
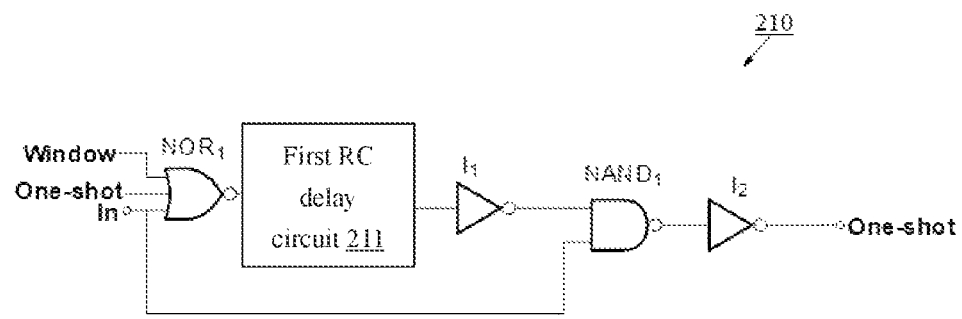
FIG. 4 is a schematic structural diagram of a one-shot circuit of an embodiment of the present disclosure.

Further, as shown in FIG. 4, the one-shot main circuit 210 includes a NOR gate $NOR_1$, a first RC delay circuit 211, a first NOT gate $I_1$, a second NOT gate $I_2$, and a NAND gate $NAND_1$. An input end of the NOR gate $NOR_1$ receives the input signal In, the feedback of the output signal One-shot, and a time window signal Window. An output end of the NOR gate $NOR_1$ is connected to the first RC delay circuit 211. The first RC delay circuit 211 is configured to delay a signal through the charging and discharging of a capacitor. An output end of the first RC delay circuit 211 is connected to an input end of the first NOT gate $I_1$. An output end of the first NOT gate $I_1$ is connected to one input end of the NAND gate $NAND_1$, the other input end of the NAND gate $NAND_1$ is connected to the input signal In, and an output end of the NAND gate $NAND_1$ is connected to an input end of the second NOT gate $I_2$. An output end of the second NOT gate $I_2$ outputs the output signal One-shot.

Figure 5:
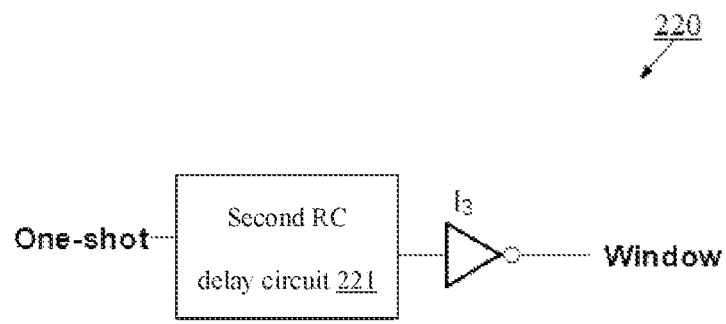
FIG. 5 is a schematic structural diagram of a shielding time window circuit of an embodiment of the present disclosure.

Further, as shown in FIG. 5, the shielding time window circuit 220 includes a second RC delay circuit 221 and a third NOT gate $I_3$. The second RC delay circuit 221 is configured to delay the signal through the charging and discharging of the capacitor. An input end of the second RC delay circuit 221 receives the feedback of the output signal One-shot, an output end of the second RC delay circuit 221 is connected to an input end of the third NOT gate $I_3$, and an output end of the third NOT gate Is outputs the time window signal Window.

Figure 6:
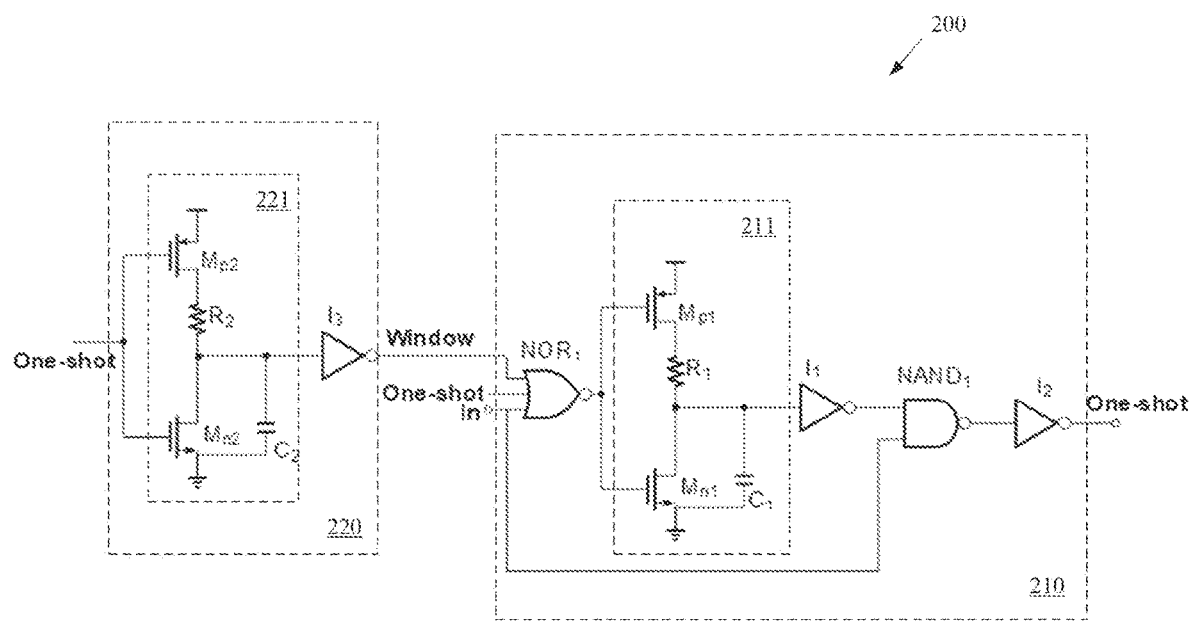
FIG. 6 is an exemplary circuit diagram of a one-shot circuit according to an embodiment of the present disclosure.

Further, as shown in FIG. 6, the first RC delay circuit 211 includes a first transistor $Mp_1$, a second transistor $Mn_1$, a first resistor $R_1$, and a first capacitor $C_1$. Gates of the first transistor $Mp_1$ and the second transistor Mn are both connected to the output end of the NOR gate $NOR_1$. A source of the first transistor $Mp_1$ is connected to a power supply end. A source of the second transistor $Mn_1$ is connected to a ground end. A drain of the first transistor $Mp_1$ is connected to one end of the first resistor $R_1$. A drain of the second transistor $Mn_1$ is connected to the other end of the first resistor $R_1$. The first transistor $Mp_1$ is a P-type transistor. The second transistor $Mn_1$ is an N-type transistor. The first capacitor $C_1$ is connected in parallel with the second transistor $Mn_1$. One end of the first capacitor $C_1$ is connected to the drain of the second transistor $Mn_1$, and the other end of the first capacitor $C_1$ is connected to the source of the second transistor $Mn_1$. An intermediate node between the first resistor $R_1$ and the second transistor $Mn_1$ is connected to the input end of the first NOT gate $I_1$. The second RC delay circuit 221 includes a third transistor $Mp_2$, a fourth transistor $Mn_2$, a second resistor $R_2$, and a second capacitor $C_2$. Gates of the third transistor $Mp_2$ and the fourth transistor $Mn_2$ both receive the feedback of the output signal One-shot. A source of the third transistor $Mp_2$ is connected to a power supply end. A source of the fourth transistor $Mn_2$ is connected to a ground end. A drain of the third transistor $Mp_2$ is connected to one end of the second resistor $R_2$. A drain of the fourth transistor $Mn_1$ is connected to the other end of the second resistor $R_2$. The third transistor $Mp_2$ is a P-type transistor. The fourth transistor $Mn_2$ is an N-type transistor. The second capacitor $C_2$ is connected in parallel with the fourth transistor $Mn_2$. One end of the second capacitor $C_2$ is connected to the drain of the fourth transistor $Mn_2$, and the other end of the second capacitor $C_2$ is connected to the source of the fourth transistor $Mn_2$. An intermediate node between the second resistor $R_2$ and the fourth transistor $Mn_2$ is connected to the input end of the third NOT gate $I_3$.

In addition, it is also to be noted that the discharging time constant of the second RC delay circuit 221 is less than a charging time length of the first RC delay circuit 211. Thus, the Window signal may become logic "1" quickly. Specifically, it may be realized by making the ratio of length to width of $Mn_2$ large, and accelerating the discharging speed. In addition, the initial low level time length of the input signal In is greater than a first preset time length. The first preset time length is the time length that the third transistor $Mp_2$ and the second resistor $R_2$ pull the input of the third NOT gate $I_3$ to a high level. This is to ensure that One-shot and Window do not affect the state of $NOR_1$ at the beginning. In addition, the sum of a discharging time length of the second RC delay circuit 221 and a charging time length of the second RC delay circuit 221 is less than or equal to a second preset time length. The second preset time length is a preset triggering interval time length of the one-shot circuit (corresponding to the time interval T in the foregoing embodiment of FIG. 1).

Figure 7:
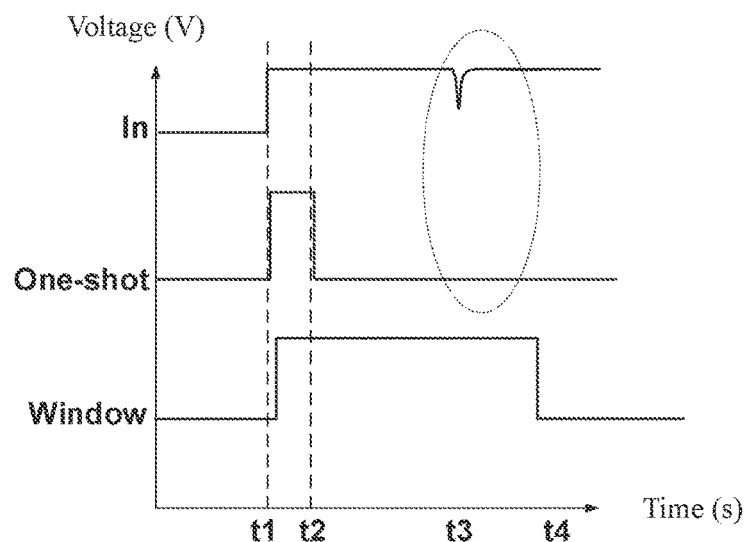
FIG. 7 is a waveform diagram of the signal corresponding to the circuit of FIG. 6.

The principle of the one-shot circuit 200 of the embodiment of the present disclosure is described in detail in combination with the abovementioned one-shot circuit 200 in FIG. 6 and the waveform diagram (the waveform diagram corresponding to the input signal In, the output signal One-shot, and the time window signal Window in sequence from top to bottom) of the signal corresponding to the one-shot circuit 200 in FIG. 7. Assuming that the initial input signal In having enough time (greater than the first preset time length) is logic "0", then the One-shot is logic "0". Since the time is long enough, $Mp_2$ and $R_2$ pull the input of the phase inverter Is up to logic "1", and the Window is logic "0". Therefore, One-shot and Window do not affect the state of $NOR_1$. $NOR_1$ is equivalent to the function of the phase inverter. At this time, the one-shot main circuit 210 is consistent with the conventional one-shot circuit 100, so the working processes are consistent. As shown in FIG. 7, at time t1, In becomes logic "1". Assuming that the impedance of $Mp_1$ may be ignored, then the charging time constant (the charging time constant of the first RC delay circuit 211) is $\tau1=R_1*C_1$. Assuming that the flipping level of all phase inverters is half of a supply voltage, a One-shot pulse signal with the width of $0.7*\tau1=0.7*R_1*C_1$ is generated by the one-shot circuit. When One-shot becomes logic "1", $Mp_2$ is turned off, $Mn_2$ is turned on to discharge $C_2$. The ratio of length to width of $Mn_2$ is large, so the discharging speed is high. The discharging time constant (the discharging time constant of the second RC delay circuit 221) may be much less than $0.7*\tau1$, so the Window signal may become logic "1" quickly. When the One-shot signal becomes logic "0" again, $Mn_2$ is turned off, $Mp_2$ is turned on, $Mp_2$ and $R_2$ charge an input node of the phase inverter $I_3$. The charging time constant (the charging time constant of the second RC delay circuit 221) is $\tau2=R_2*C_2$. Before the output of $I_3$ flips, the Window signal is always logic "1". When One-shot signal or Window signal is logic "1", the output of $NOR_1$ is always logic "0". An abnormal pulse on the input signal In will not affect the output of $NOR_1$, so the One-shot signal will not be triggered by mistake. After the time $0.7*\tau2=0.7*R_2*C_2$, One-shot signal and Window are both logic "0". At this time, the one-shot circuit can only receive a triggering signal of the input In. It can be seen from the abovementioned analysis and the waveform diagram of FIG. 7, when One-shot signal or Window signal is logic "1", One-shot signal will not be triggered by mistake. It can be seen from FIG. 7 that the time period of One-shot signal or Window signal being logic "1" is the time length between t1 and t4. This time period is the discharging time length of the second RC delay circuit 221+the charging time length of the second RC delay circuit 221. Therefore, if the time length of this period is equal to the preset triggering interval time length of the one-shot circuit, which can ensure that false triggering will be avoided within the preset triggering interval time length of the one-shot circuit. The discharging time length of the second RC delay circuit 221 and the charging time length of the second RC delay circuit 221 may be adjusted conveniently according to the parameters of circuit elements in the second RC delay circuit. In addition, if the time when the abnormal pulse appears may be predicted in advance, the right boundary of this period of time length of the discharging time length of the second RC delay circuit 221+the charging time length of the second RC delay circuit 221 may be adjusted to the time after the end of the abnormal pulse (that is, the discharging time length of the second RC delay circuit 221+the charging time length of the second RC delay circuit 221 is greater than or equal to the time length from the beginning of the input signal to the end of the abnormal pulse, and is less than or equal to the preset triggering interval time length of the one-shot circuit).

In conclusion, the one-shot circuit 200 of the embodiment of the present disclosure adds the feedback of the output signal One-shot and the shielding time window circuit 220 to the conventional one-shot circuit, which can prevent the false triggering caused by the abnormal pulse of the input signal In. The one-shot circuit is in a certain time window, the one-shot circuit is in an anti-interference state, and is not interfered with the abnormal pulse of the input signal In. During normal operation, the width of the shielding time window does not affect the pulse width of the One-shot signal.

The descriptions of the same or corresponding module units in various embodiments of the present disclosure may be referred to each other.

In the above description, the well-known structural elements and steps are not described in detail. However, those skilled in the art should understand that corresponding structural elements and steps can be realized by various technical means. In addition, in order to form the same structural elements, those skilled in the art may also design methods that are not completely the same as those described above. In addition, although various embodiments are separately described above, this does not mean that the measures in various embodiments cannot be combined for use advantageously.

According to the embodiments of the present disclosure, as described above, these embodiments do not fully describe all details, or limit the specific embodiments of the present disclosure. Apparently, according to the above description, many modifications and changes can be made. Selection and specific description of these embodiments in the specification is to better explain the principle and actual application of the present disclosure, so that those skilled in the art can make good use of the present disclosure and modification and use based on the present disclosure. The scope of protection of the present disclosure shall be subject to the scope of protection of the claims of the present disclosure.

Unless otherwise indicated clearly in the context, the singular form of terms used herein and in the appended claims includes the plural, and vice versa. Therefore, when referring to the singular, it usually includes the plural of the corresponding term. Similarly, the words "include" and "comprise" will be interpreted as inclusive rather than exclusive. Similarly, the terms "include" and "or" shall be interpreted as including, unless such interpretation is expressly prohibited herein. Where the term "example" is used herein, particularly when it is behind a group of terms, the "example" is only exemplary and illustrative, and should not be considered exclusive or extensive.

Further aspects and scope of adaptability become apparent from the description provided herein. It is to be understood that various aspects of the present disclosure may be implemented separately or in combination with one or more other aspects. It is also to be understood that the description and specific embodiments herein are for illustrative purposes only and are not intended to limit the scope of the present disclosure.

Several embodiments of the present disclosure have been described in detail above. However, apparently, those skilled in the art can make various modifications and variants to the embodiments of the present disclosure without departing from the spirit and scope of the present disclosure. The scope of the present disclosure is limited by the appended claims.

What is claimed is:

1. A one-shot circuit, comprising:
a one-shot main circuit comprising:
a NOR gate configured to receive an input signal of the one-shot circuit, a feedback of an output signal of the one-shot circuit, and a time window signal,
a first Resistance-Capacitance (RC) delay circuit,
a first logic gate,
wherein the output signal is generated by the first RC delay circuit and the first logic gate; and
a shielding time window circuit is configured to receive the feedback of the output signal and generate the time window signal through a second RC delay circuit and a second logic gate.

2. The one-shot circuit according to claim 1, wherein the one-shot main circuit comprises a first NOT gate, a second NOT gate, and a NAND gate, wherein
an input end of the NOR gate receives the input signal, the feedback of the output signal, and the time window signal; an output end of the NOR gate is connected to the first RC delay circuit;
the first RC delay circuit is configured to delay a signal through a charging and discharging of a capacitor; an output end of the first RC delay circuit is connected to an input end of the first NOT gate;
an output end of the first NOT gate is connected to a first input end of the NAND gate, a second input end of the NAND gate is connected to the input signal, and an output end of the NAND gate is connected to an input end of the second NOT gate; and
an output end of the second NOT gate outputs the output signal.

3. The one-shot circuit according to claim 2, wherein the shielding time window circuit comprises the second RC delay circuit and a third NOT gate, wherein
the second RC delay circuit is configured to delay the signal through the charging and discharging of the capacitor; an input end of the second RC delay circuit receives the feedback of the output signal, an output end of the second RC delay circuit is connected to an input end of the third NOT gate, and an output end of the third NOT gate outputs the time window signal.

4. The one-shot circuit according to claim 3, wherein the first RC delay circuit comprises a first transistor, a second transistor, a first resistor, and a first capacitor, wherein
gates of the first transistor and the second transistor are connected to the output end of the NOR gate; a source of the first transistor is connected to a first power supply end; a source of the second transistor is connected to a first ground end; a drain of the first transistor is connected to a first end of the first resistor; a drain of the second transistor is connected to a second end of the first resistor; the first transistor is a P-type transistor; the second transistor is an N-type transistor;
the first capacitor is connected in parallel with the second transistor; a first end of the first capacitor is connected to the drain of the second transistor, and a second end of the first capacitor is connected to the source of the second transistor; and
an intermediate node between the first resistor and the second transistor is connected to the input end of the first NOT gate.

5. The one-shot circuit according to claim 4, wherein the second RC delay circuit comprises a third transistor, a fourth transistor, a second resistor, and a second capacitor, wherein
gates of the third transistor and the fourth transistor are connected to the feedback of the output signal; a source of the third transistor is connected to a second power supply end; a source of the fourth transistor is connected to a second ground end; a drain of the third transistor is connected to a first end of the second resistor; a drain of the fourth transistor is connected to a second end of the second resistor; the third transistor is a P-type transistor; the fourth transistor is an N-type transistor;
the second capacitor is connected in parallel with the fourth transistor; a first end of the second capacitor is connected to the drain of the fourth transistor, and a second end of the second capacitor is connected to the source of the fourth transistor; and
an intermediate node between the second resistor and the fourth transistor is connected to the input end of the third NOT gate.

6. The one-shot circuit according to claim 5, wherein a discharging time constant of the second RC delay circuit is less than a charging time length of the first RC delay circuit.

7. The one-shot circuit according to claim 6, wherein an initial low level time length of the input signal is greater than a first preset time length; and the first preset time length is the time length when the third transistor and the second resistor pull an input of the third NOT gate to a high level.

8. The one-shot circuit according to claim 7, wherein a sum of a discharging time length of the second RC delay circuit and a charging time length of the second RC delay circuit is less than or equal to a second preset time length; and the second preset time length is a preset triggering interval time length of the one-shot circuit.

9. The one-shot circuit according to claim 8, wherein the sum of the discharging time length of the second RC delay circuit and the charging time length of the second RC delay circuit is greater than or equal to a time length from a beginning of the input signal to an end of the abnormal pulse.

10. The one-shot circuit according to claim 1, wherein the one-shot circuit is a one-shot circuit in a low-speed chip.

11. A one-shot circuit, comprising a NOR gate, first to fourth transistors, a first resistor, a second resistor, a first capacitor, a second capacitor, a first NOT gate, a second NOT gate, a third NOT gate, and a NAND gate, wherein
an input end of the NOR gate receives an input signal of the one-shot circuit, a feedback of an output signal of the one-shot circuit, and a time window signal; an output end of the NOR gate is connected to a gate of the first transistor and a gate of the second transistor;
a source of the first transistor is connected to a first power supply end; a source of the second transistor is connected to a first ground end; a drain of the first transistor is connected to a first end of the first resistor; a drain of the second transistor is connected to a second end of the first resistor; the first transistor is a P-type transistor; the second transistor is an N-type transistor;

the first capacitor is connected in parallel with the second transistor; a first end of the first capacitor is connected to the drain of the second transistor, and a second end of the first capacitor is connected to the source of the second transistor; an intermediate node between the first resistor and the second transistor is connected to an input end of the first NOT gate;

an output end of the first NOT gate is connected to a first input end of the NAND gate, and a second input end of the NAND gate is connected to the input signal; an output end of the NAND gate is connected to an input end of the second NOT gate; an output end of the second NOT gate outputs the output signal;

a gate of the third transistor and a gate of the fourth transistor receive the feedback of the output signal; a source of the third transistor is connected to a second power supply end; a source of the fourth transistor is connected to a second ground end; a drain of the third transistor is connected to a first end of the second resistor, and a drain of the fourth transistor is connected to a second end of the second resistor; the third transistor is a P-type transistor; the fourth transistor is an N-type transistor;

the second capacitor is connected in parallel with the fourth transistor; a first end of the second capacitor is connected to the drain of the fourth transistor, and a second end of the second capacitor is connected to the source of the fourth transistor;

an intermediate node between the second resistor and the fourth transistor is connected to an input end of the third NOT gate; and an output end of the third NOT gate outputs the time window signal.

\* \* \* \* \*